(12) United States Patent
Fellinger et al.

(10) Patent No.: US 11,604,739 B2
(45) Date of Patent: Mar. 14, 2023

(54) CONDITIONAL DIRECT MEMORY ACCESS CHANNEL ACTIVATION

(71) Applicant: NXP USA, Inc., Austin, TX (US)

(72) Inventors: Viktor Fellinger, Niedernberg (DE); Osvaldo Israel Romero Cortez, Munich (DE); John Mitchell, Round Rock, TX (US)

(73) Assignee: NXP USA, Inc., Austin, TX (US)

( * ) Notice: Subject to any disclaimer, the term of this patent is extended or adjusted under 35 U.S.C. 154(b) by 120 days.

(21) Appl. No.: 17/114,933

(22) Filed: Dec. 8, 2020

(65) Prior Publication Data

US 2022/0179800 A1   Jun. 9, 2022

(51) Int. Cl.
| | |
|---|---|
| *G06F 12/1081* | (2016.01) |
| *G06F 12/0817* | (2016.01) |
| *H03K 19/17728* | (2020.01) |
| *G06F 9/46* | (2006.01) |
| *G06F 12/02* | (2006.01) |

(52) U.S. Cl.
CPC .......... *G06F 12/1081* (2013.01); *G06F 9/467* (2013.01); *G06F 12/0238* (2013.01); *G06F 12/0822* (2013.01); *H03K 19/17728* (2013.01)

(58) Field of Classification Search
CPC .. G06F 9/467; G06F 12/0238; G06F 12/0822; G06F 12/1081; H03K 19/17728
See application file for complete search history.

(56) References Cited

U.S. PATENT DOCUMENTS

| | | | |
|---|---|---|---|
| 5,619,727 A | 4/1997 | Chen et al. | |
| 5,737,231 A | 4/1998 | Pyle et al. | |
| 7,415,549 B2 | 8/2008 | Vemula et al. | |
| 2012/0158096 A1* | 6/2012 | Sherman | G06F 13/28 607/59 |
| 2018/0088978 A1* | 3/2018 | Li | G06F 13/28 |

FOREIGN PATENT DOCUMENTS

EP   1564643 A2   8/2005

OTHER PUBLICATIONS

Infineon, "AURIX TC38x User's Manual," V1.5.0, Apr. 2020; 1087 pages.
Ma et al., "Design and Implementation of an Advanced DMA Controller on AMBA-Based SoC," 2009 IEEE 8th International Conference on ASIC, Oct. 20-23, 2009, pp. 419-422; 4 pages.

\* cited by examiner

*Primary Examiner* — Aracelis Ruiz

(57) ABSTRACT

A conditional direct memory access (DMA) channel activation system for executing a complex data transfer in a system-on-chip, comprising: a look-up table constructed and arranged to store elements of an activation profile; and a trigger circuit that controls a DMA transaction according to the activation profile of the look-up table.

19 Claims, 6 Drawing Sheets

| Entry | Domain ID | Trigger | Address | Mask | Operand | Operation | DMA Ch. | CDCA Ch. |
|---|---|---|---|---|---|---|---|---|
| 0 | 0 | Event | 0x0000_FFFF | 0x0000_1000 | | | | |
| 1 | 0 | Timer | 0x1000_0000 | 0x1000_0000 | Op1 | XOR | 4 | 4 |
| 2 | 0 | Timer | 0x1000_FFF0 | 0x1000_FFFF | Op2 | AND | 2 | |
| 3 | 1 | Software | 0x1000_FFF0 | 0x1000_0000 | Op3 | OR | 11 | |
| 4 | 1 | Linked | 0x1001_0000 | 0xFFFF_FFF7 | Op0 | NOR | 8 | |

FIG. 3

CONDITIONAL DIRECT MEMORY ACCESS CHANNEL ACTIVATION

FIELD

The present disclosure relates generally to a direct memory access (DMA) controller for a computer architecture, and more specifically, to a DMA controller that performs a conditional DMA channel activation operation for executing a complex data transfer in a system-on-chip (SoC).

BACKGROUND

Modern vehicles often comprise a substantial number of electronic control units (ECUs) which receive and process signals from various sensors or the like distributed throughout the vehicle. ECUs require more processing power as additional complex systems are added to vehicles, such as autonomous driving and smart cockpit systems, resulting in a significant load on the central processing unit (CPU) required to control the various systems. The amount of software developed to process the increasing number of tasks the ECU needs to perform continues to grow.

Because of this, there is the need for a solution that helps reduce the overloaded CPU resources so that the CPU can focus on critical electronic systems such as safety, security, and advanced driver-assistance systems (ADAS).

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is an illustrative example of a CDCA look-up table, in accordance with an example embodiment of the present disclosure.

DETAILED DESCRIPTION

A DMA (Direct Memory Access) controller can reduce the CPU overload in a modern computer network system. A DMA controller is capable of performing complex data transfers with minimal intervention of a CPU. Typically, a DMA is composed of multiple channels, each having a transfer profile in which the source address and the destination address is indicated. In conventional configurations when a data transfer is triggered, the DMA transfers the data at the source address to the destination address. The trigger for these data transfers is often a service request signal from a variety of peripherals in a computer chip such as timers, communication peripherals, analog-to-digital converters, and so on. These service request signals are preconfigured in hardware via a DMA multiplexer at which the user selects which peripheral triggers a specific DMA channel, for example, allowing for a high speed device to communicate directly with the main memory (RAM). The limitation of this methodology is that if a peripheral device's service request signal or a related address was not included in the DMA multiplexor map during the hardware definition phase of the system-on-chip (SoC) development, then that peripheral cannot request desirable DMA services. This has a significant impact on flexibility. Certain peripherals may be omitted and cannot request DMA services. Another limitation is that neither the DMA multiplexer nor the DMA device itself can execute a comparison or any logical operation of data to trigger a DMA channel. The service request, or trigger, is binary. The DMA does not have a mechanism to perform a comparison or logical operation to trigger a DMA channel.

In brief overview, a conditional DMA channel activation (CDCA) system and method are provided in some embodiments that addresses and overcomes the limitations mentioned above. The CDCA system and method solve the limitations mentioned above by adding flexibility to the DMA triggers and optionally performing a comparison or logic operation before triggering a data transaction. For example, multiple activation sources that can be used to trigger DMA transactions based on the contents of a memory mapped address. A DMA channel can receive its trigger for a transfer through a multiplexer that selects a data signal from a plurality of received signals, such that when the selected signal is activated, a trigger for a transfer occurs. Accordingly, any bit within a register or any memory mapped address can trigger the DMA and allow a chain of activation conditions to be part of the triggering of a DMA transaction.

Figure 1:
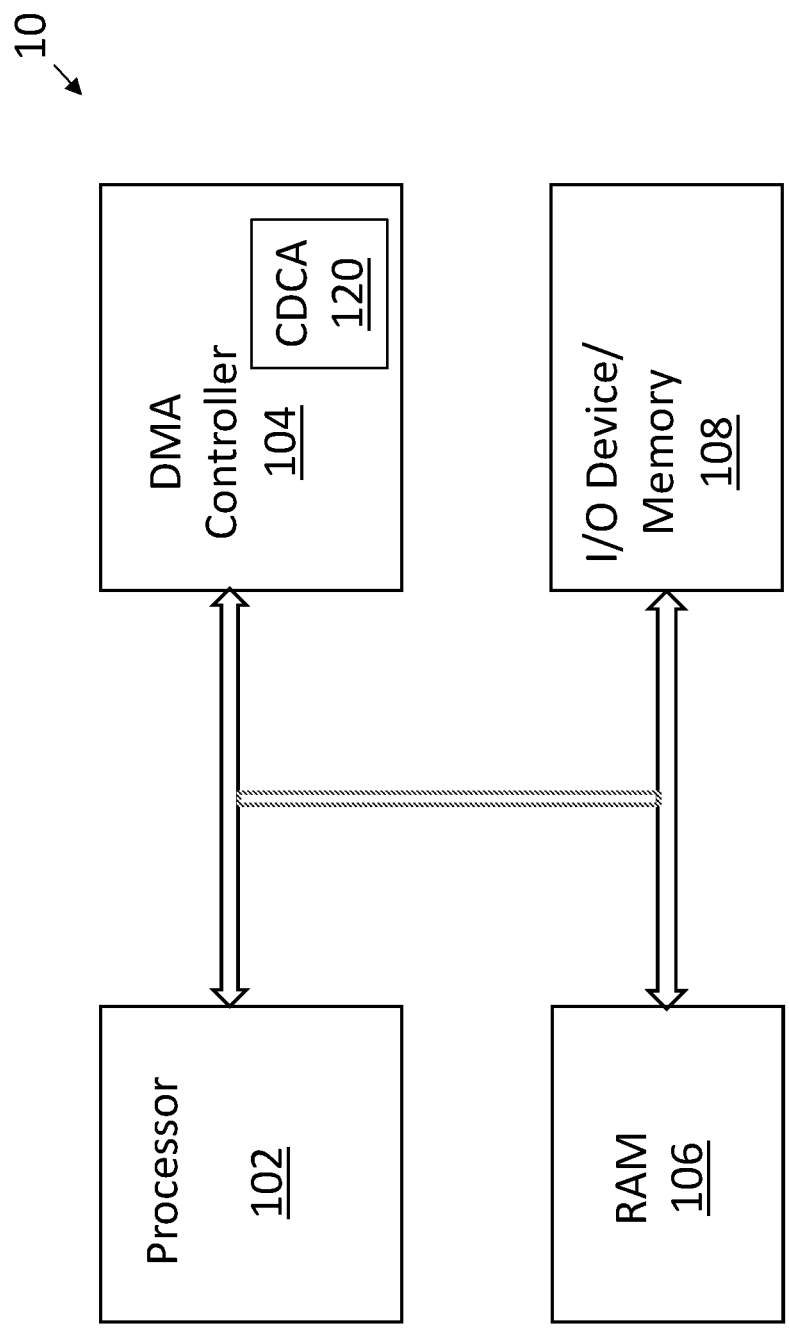
FIG. 1 is a block diagram of a computer architecture that includes a DMA controller, in accordance with an example embodiment of the present disclosure.

FIG. 1 is a block diagram of a computer architecture 10 that includes a DMA controller 104, in accordance with an example embodiment of the present disclosure. In some embodiments, the computer architecture is a system-on-chip (SoC) architecture. In some embodiments, some or all of the computer architecture 10 is part of a special purpose hardware computer processor such as a microcontroller unit (MCU), microprocessor unit (MPU), or the like depending on various automotive, industrial, and consumer applications so long as the application requires DMA. For example, the computer architecture 10 may be constructed and arranged as an MCU or MPU that provides intelligence to an automotive system, such as driving and smart cockpit systems for an autonomous or semi-autonomous vehicle.

In some embodiments, the computer architecture 10 combines a processor 102 with the DMA controller 104, a random access memory (RAM) device 106, and other peripheral subsystems 108 on a single integrated circuit. Data is transferred via the DMA controller 104 between the RAM 106 and peripherals 108 by a data bus capable of transferring data across multiple channels. The DMA controller 104 therefore contributes to an increased data transfer rate and processor efficiency, for example when implemented in a SoC system or the like, for example, implemented in a SoC based ECU or the like.

The DMA controller 104 includes a conditional DMA channel activation (CDCA) system 120 comprising hardware and/or a combination of hardware and software.

Figure 2:
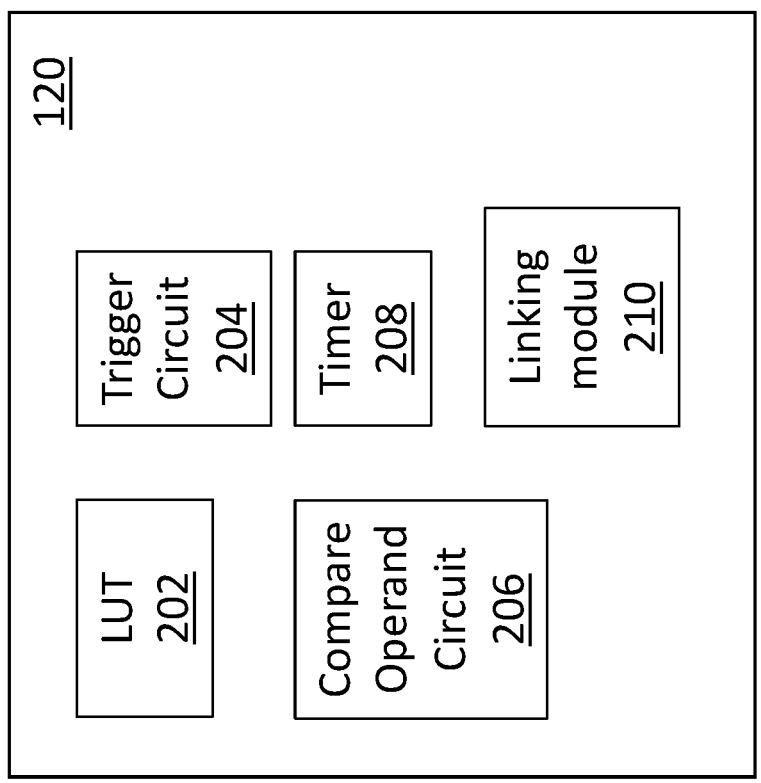
FIG. 2 is a schematic diagram of a conditional DMA channel activation (CDCA) system of FIG. 1.

As shown in FIG. 2, the CDCA system 120 includes a special-purpose look-up table (LUT) 202 that is stored in a memory device, for example, a hardware static program storage of the DMA controller 104, i.e., used to record the completion of DMA transfers. In some embodiments, the LUT 202 is co-located in the DMA. In other embodiments, the LUT 202 is external to but in electronic communication with the DMA. Here, the LUT 202 can be instead co-located with a CDCA processing element and protected by a memory protection device or technique, and more specifically, each LUT entry is individually protected with respect to a read, write, execute, and so on. In some embodiments, the LUT 202 is a programmable look-up table. Here, the DMA may read a location in memory as soon as the location is written to memory. The memory location is given by the address input in the CDCA LUT 202. The LUT 202 includes a set of required information for triggering a DMA transaction, for example, illustrated in FIG. 3.

In some embodiments, referring to FIG. 3, the CDCA LUT 202 includes a set of elements, fields, data structures, or other computer storage arrangements including but not limited to an Entry field 301, a Domain ID field 302, a DMA CDCA Trigger field 303, an Address field 304, a Mask field 305, a Result Operand field 306, an Operation field 307, a DMA Channel Trigger field 308, and a Conditional DMA Channel (CDC) trigger field 309.

The Entry field 301 of the LUT 202 includes an entry number used by the processor 102, or other special-purpose processor in communication with the DMA controller 104 that in some embodiments maps directly to a CDCA channel, for example, in operations including a chaining of channels. A CDCA channel distinguishes from a DMA channel, which allows high speed devices to communicate directly with a RAM device and/or other SoC resources such as memory-accessed SoC peripheral electronic components. The trigger circuit 204 of the CDCA system 120 can activate the prescribed DMA channel and/or link to another CDCA channel. As is well-known, a DMA channel is a processing element that is triggered to execute a copy operation, e.g., from a peripheral device to RAM. The DMA channel can execute a prescribed transfer when activated. A CDCA channel, on the other hand, is a LUT entry that defines a further action. For example, a read from a particular address is compared against a constant, and if TRUE triggers another DMA channel which may be part of a linked CDCA channel. In some embodiments, a SoC may implement the DMA controller 104 having 32 channels. Here, a CDCA channel, also referred to as a CDCA entry, is in the LUT 202 that corresponds to a prescribed activation profile.

The Domain ID field 302 supports a virtualization of the application. For example, a virtualization can include multiple applications or tasks running at the same time in a SoC. In this example, each core in the SoC executes a specific task or application. These tasks/applications may be required to be independent to each other, even though they are in the same SoC. Hence the SoC may include resources that can be accessed by a particular core performing a specific task. Here, with respect to the CDCA, the domain ID will indicate which core has access to which elements of the LUT 202. Once a specific task/application is complete, their resources can be released and subsequently used by another task or application of the SoC.

The Domain ID 302, also referred to as a Master ID, identifies the core ownership or indicates which core or domain owns the information in the CDCA LUT 202. In some embodiments, the system is in a CDCA software mode, whereby the CDCA channel (distinguished from a DMA channel) is explicitly activated by software. Here, activation of the CDCA channel, for example identified in the Entry filed 301, is controlled, for example, optionally restricted by the Domain ID in the field 302.

The DMA CDCA Trigger field 303 includes a table entry that defines the activation method of the comparison or logical operation between data and a mask. There are two types of activators: a polling mode or a triggered mode. In the triggered mode, triggering or channel activation options may include software, an IP flag, or another CDCA channel, each described in greater detail below.

The Address field 304 includes a table entry including an address that points to the location of a Compare Operand. The address in the Address field 306 can be a register address or data address in embedded flash, RAM, or external memory. For each logical channel, an entry includes the address to be monitored. The DMA reads a certain location as soon as the location is written in memory. The location is given by the address in the Address field 306.

Referring again to FIG. 2, a compare operand circuit 206 of the CDCA system 120 can perform a comparison operation, such as bitwise/don't care bits/OR/AND/XOR/XNOR comparison or logic operation before triggering a data transaction. This permits any bit within a register or any memory mapped address, e.g., any value in a memory location, to trigger the DMA.

The Mask field 305 includes a table entry including mask data used in an operation with the Compare Operand. In some embodiments, the mask data is programmed by software at a LUT parameter during an initialization procedure. The contents of the mask field 305 can be changed during device operation depending on application needs.

The Result Operand field 306 includes a table entry including a constant value representing a matching result after an operation. For example, a comparison operation includes a logical operation between a mask and a Compare Operand. In a related example, a comparison is made between a Compare Operand and the data read from the address defined in a corresponding LUT Entry.

The Operation field 307 identifies the logical operation to perform between the Mask and the Compare Operand, for example, OR, AND, XOR, XNOR, shift, compare, threshold and so on, but not limited thereto.

The DMA Channel Trigger field 308 indicates which DMA channel will be triggered for trigging a data transfer or movement.

The Conditional DMA Channel (CDC) trigger field 309 provides the option to have an activated CDCA channel trigger the comparison of another entry in the LUT 202. This allows a chaining of channels as well as a chain of logical operations depending on the data content, referred to as CDC entry linking. For example, when a peripheral receives new data a first CDCA LUT entry is activated based on this data, for example, reading the data from the address stored in LUT Entry field 301. The data is compared with a mask value. If match is determined, i.e., a TRUE result, and the first CDCA LUT entry contains a valid CDCA channel and link bit set, i.e., a second LUT Entry is linked and triggered to become active. The second LUT Entry is active and reads a predefined address in a RAM or other computer memory, e.g., managed by security software, which corresponds to the security setting which defines whether it is allowed to copy that data from peripheral into a secure buffer or the like. If a comparison result is TRUE then the second LUT entry triggers the second DMA channel, which copies the data from the peripheral to the secure buffer. Accordingly, the system can allow a chain of activation conditions to be part of the triggering of a DMA transaction. In this example, the trigger circuit 202 relies on the activation conditions defined in the LUT 202 to trigger the writing of the data associated with the DMA request selected by the buffer.

Returning to FIG. 2, the CDCA system 120 is constructed and arranged to add a new block, referred to as a CDCA Block, to the DMA controller 104. The block includes an implementation of an LUT 202 and corresponding control logic. In some embodiments, the CDCA system 120 includes the LUT 202, trigger circuit 204, compare operand circuit 206, a timer 208, and a linking module 210, some or all implemented at the DMA controller 104 and/or other elements of the computer architecture 10. Some or all of the LUT 202, trigger circuit 204, compare operand circuit 206, a timer 208, and a linking module 210 is formed of hardware, software executed by a special-purpose hardware processor, or a combination thereof.

As previously described, the trigger circuit 204 includes one or more electronic components that can activate the prescribed DMA channel and/or link to another CDCA channel, and the compare operand circuit 206 can perform a logic operation such as a comparison between a Compare Operand and a Result Operand or the data read from the address defined in corresponding LUT Entry, before triggering a data transaction. For example, when Compare Operand equals "data @ address pointer," a Modified Compare Operand equals the Compare Operand with a mask operation applied. If the Modified Compare Operand equals the Result Operand, then the trigger circuit 204 executes a trigger. This comparison can be triggered by an IP flag, software bit, other CDCA channel, or other activation mechanism or signal. Accordingly, the trigger circuit 204 can participate in a controlled data transfer involving the DMA, multiplexer, etc. by performing more automatic triggering according to conditions set forth by the LUT 202.

The timer 208 has a predefined period trigger, or communicates with the trigger circuit, for activating a CDCA channel when a CDCA triggered mode is a timer mode. The timer 208 can generate timing and control signals to control read/write cycles of the DMA, for example, in the timer mode.

The linking module 210 permits a CDCA channel to be linked by a match in another CDCA channel when a CDCA triggered mode is a linked mode. In some embodiments, a chain of activation conditions may be implemented. For example, a comparison result of a (data read for address 304) operation 307 (operand 306)=TRUE. Another activation condition may be a (data read for address 304) operation 307 (mask 305)=TRUE. Another activation condition may be a (((data read for address 304) AND (mask 305)) operation 307 (operand 306)=TRUE. Another activation condition may be a (((data read for address 304) OR (mask 305)) operation 307 (operand 306)=TRUE.

As previously described, in some embodiments, DMA channels use the LUT 202 to look up a trigger profile, and the entry number of the LUT Entry field 301 can provide a direct mapping to a CDCA channel, also referred to as a CDCA entry. A trigger profile is established by the contents of one or more fields of the LUT 202. In embodiments wherein the CDCA system 120 triggers a CDCA channel, the DMA controller 104 can operate in two different activation modes, or options: a software mode or a triggered mode, established by the LUT 202. Accordingly, the CDCA system 120 permits the DMA controller 104 with flexibility to select between multiple activation sources and destinations, and by triggering DMA channels based on the contents of a memory mapped address, e.g., a value in a memory location using the LUT 202. For example, the CDCA system 120 can detect the change of data at a specific memory address that triggers the DMA transaction.

Figure 4:
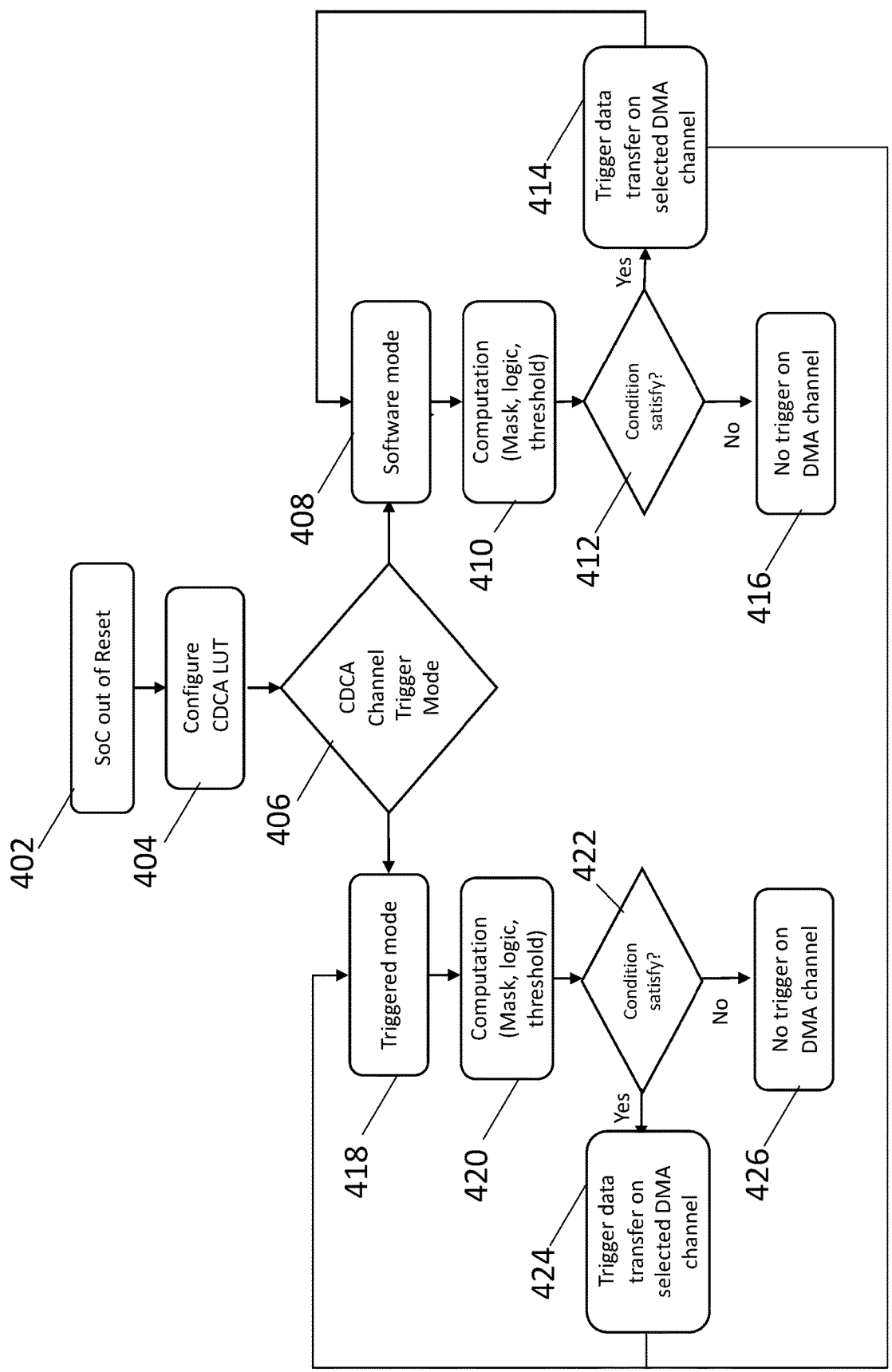
FIG. 4 is a flowchart illustrating a CDCA operation, in accordance with an example embodiment of the present disclosure.

FIG. 4 is a flowchart illustrating a CDCA operation, in accordance with an example embodiment of the present disclosure. In describing the CDCA operation, reference is made to elements of FIGS. 1-3.

At block 402, a SoC or the like at which a CDCA is implemented, for example, shown in FIGS. 1 and 2, is in a post-reset state, i.e., after a boot operation of the SoC is performed. In some embodiments, the SoC is in a state to perform the CDCA operation regardless of whether a reset operation is performed.

At block 404, a CDCA look-up table (LUT) is constructed and configured to record the completion of DMA transfers, for example, shown in FIG. 3. However, the CDCA LUT is also used to trigger the DMA channels transactions rather than merely track the status of DMA transfers. In some embodiments, application software can activate a CDCA channel by setting i.e., an active bit, in a corresponding CDCA trigger activation register. In some embodiments, the CDCA LUT 202 can be configured by user software, using a set of register or software descriptor for each entry of the LUT. A user via software writes the LUT with the desired configuration. Each entry of the LUT 202 could have an associated register, where software configures the mask, operand, operation, etc.

At decision diamond 406, a CDCA channel trigger mode is determined. A CDCA channel trigger mode can be a software mode or triggered mode. If a determination is made that the CDCA channel trigger mode is a software mode, then the method moves to block 408, where a CDCA channel is explicitly activated by software. For example, a software mode entry can be performed a computation when the software changes the state of a bit, flag, or the like. No dependency of another peripheral, such as an expiration of a timer to execute the computation. In some embodiments, activation is restricted by the domain ID 302.

At block 410, in the software mode, a computation is performed. In some embodiments, the computation includes a compute operation with a mask value for a subsequent comparison with a compare operand for triggering a DMA transaction. In some embodiments, the computation includes a threshold. For example, step may include the following: IF (Data Read from Address 304)>(Operand 306) =TRUE=>activate DMA transaction. In this example, the operand is functioning as a low threshold for the data. An operand could be also be "<" or less than corresponding to a high threshold for an activation condition. By combining a threshold with the CDCA entry linking, range checking by the system can be performed. For example, IF (Data Read from Address 304)>(Operand_1 306)=TRUE=>another CDCA entry is activated. Another example is: IF (Data Read from Address 304)<(Operand_2 306)=TRUE=>in range, which in response the system activates a DMA transaction.

At decision diamond 412, a determination is made whether a condition is satisfied. The Compare Operand is read by the CDCA and after an operation with the mask value is compared to the Result Operand according to a comparison operation performed by the compare operand logic 206, which may include but not be limited to bitwise, don't care bits, OR, AND, XOR, XNOR, and so on. If match is determined, then the method proceeds to block 414 where the CDCA activates the prescribed DMA channel and/or links to another CDCA channel. Otherwise, the method proceeds to block 416, where no trigger action is performed in the CDCA software mode.

Returning to decision diamond 406, if a triggered mode is determined, then the method proceeds to block 418, where in the CDCA triggered mode one of three different types of the triggered mode is executed. The first option is an event mode, where the DMA reads certain location as soon as the location is written. The location is given by the address input in the CDCA LUT 202.

The second option is a timer mode where the timer 208 with a predefined period trigger activates the CDCA channel. The third option is a linked mode where a CDCA channel can be linked by the linking module 210 by a match in another CDCA channel. In the linked mode, a chain of "activation conditions" can be implemented.

At block 420, in the software mode, a computation is performed. In some embodiments, the computation includes a compute operation with a mask value for a subsequent comparison with a compare operand.

At decision diamond 422, a determination is made whether a condition is satisfied. The Compare Operand is read by the CDCA and after an operation with the mask value is compared to the Result Operand according to a comparison operation which may include but not be limited to bitwise, don't care bits, OR, AND, XOR, XNOR, and so on. If match is determined, then the method proceeds to block 424 where the CDCA activates the prescribed DMA channel and/or links to another CDCA channel. Otherwise, the method proceeds to block 426, where no trigger action is performed in the CDCA software mode.

Referring again to the abovementioned event mode, a set of variables are provided, for example, by a customer, that a relevant for triggering DMA transactions. In the event mode, a first option is to define a memory block within an SRAM or other memory. A comparator can be used to determine whether a write to this block has been taken. If a written is performed, then a trigger is output to the CDCA system 120. A second option is to define an MPU entry or descriptor that can generate a trigger signal to the CDCA system 120 when a determination is made that an access to the configured memory range is valid. Each CDCA channel in the LUT 202 can have an attribute referred to as "Event Mode" enabled or the like, which reads the address from the LUT entry based on the trigger according to either the first or second option. A comparison can be performed using the logical operation field in the LUT 202 and trigger a DMA channel transaction when a match is determined.

With further regard to the abovementioned timer mode, the timer 208 determines the periodicity of the reads of the value by the DMA hardware, or other periodic signal external to the DMA block, which avoids bus saturation by the reads because only one bus transaction at a time is provided per timer interval. The DMA periodically monitors the location to detect the value change when it is written.

Figure 5:
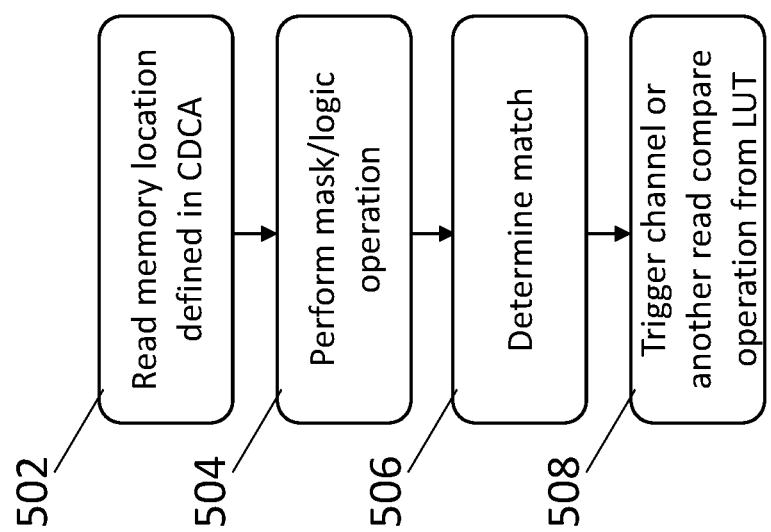
FIG. 5 is a flowchart illustrating a CDCA operation, in accordance with another example embodiment of the present disclosure.

FIG. 5 is a flowchart illustrating a CDCA operation, in accordance with another example embodiment of the present disclosure. In describing the CDCA operation, reference is made to elements of FIGS. 1-3.

At block 502, the CDCA system 120 reads a memory location defined in the LUT 202.

At block 504, the CDCA performs a mask or logic operation with an operand 306 defined in the LUT 202.

At block 506, a match is determined in response to comparing the operand read by the CDCA system 120 and after an operation with a mask value to a result operand.

At block 508, a channel defined in the LUT or another read compare operation in the LUT is triggered.

Figure 6:
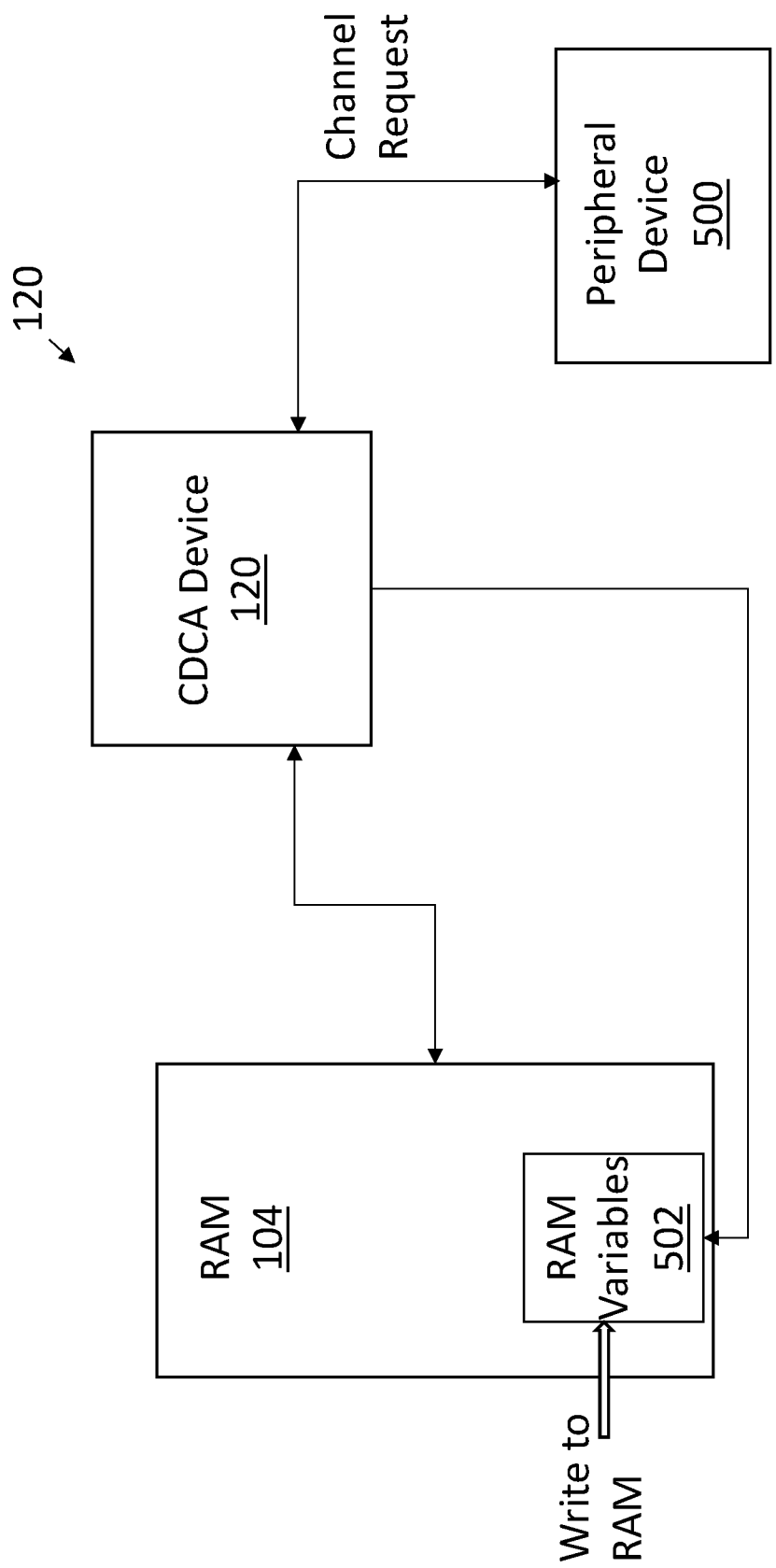
FIG. 6 is a block diagram illustrating a triggering operation between a CDCA system and RAM memory of a computer architecture, in accordance with an example embodiment of the present disclosure.

FIG. 6 is a block diagram illustrating a triggering operation between a CDCA device and RAM memory of a computer architecture, in accordance with an example embodiment of the present disclosure.

The CDCA device 120 can trigger a read access to any address in a device address map and identified in the LUT 202, for example, based on a timer event. For example, in an automotive system MPU, a motor control signal may have a predetermined control loop period. The duty cycles or period of a timer signal can be measured by the system. The corresponding application readily knows the maximum and minimum updated period. With this information, the CDCA device 120 can generate a triggering scheme to read an address of the peripheral device 500 or memory location of RAM variables 502 defined in the LUT 202 to issue a CDCA internal compare operation and trigger a DMA transaction in response to a match determined from the compare operation.

As previously mentioned, a DMA transfer between RAM 104 and peripheral memory 500 can be periodically triggered by the CDCA device 120. In doing so, the chip or other device can include a plurality of timers to process multiple trigger periods for different use cases. The RAM variable block 502 can provide the capability to output a trigger signal on each write to the relevant memory area in the RAM variable block. Accordingly, a CDCA Read can be triggered by a write to the RAM block. In other embodiments, a hit signal for an MPU region can be connected to the CDCA device 120 to trigger a read from a particular address or a sequence of reads in a chaining application.

The improvements noted above may be specified in a manner known to one of ordinary skill in the art. Advantages include the following. Any register or bit in a memory map may be used to trigger a DMA transaction. Maximum flexibility is offered with respect to multiple different DMA trigger options. The address of a memory location to be read can be itself changed by DMA, which provides for a flexible arrangement of DMA chains dependent thereon. A chain of logic compare operations from different memory location may trigger a DMA transaction. Other benefits include low latency for critical system functions (no interrupts to the CPU to perform the critical task which sometime is only checking a few bits in some registers) and low latency response for safety critical operations. The CDCA system in some embodiments may be used to further simplify or even eliminate the use of a DMA multiplexer. Another feature is that an Ethernet parser does not offer CDCA functionality, and instead only operates on received data while DMA channel is already active. The CDCA system on the other hand may read the data by itself (polling or triggered). Conventional DMA technologies also only offers accept/reject options and destination address selection: The CDCA system, however, offers a flexible selection of DMA channel or trigger further reads and logic operations (chain of logic operations).

As will be appreciated, embodiments as disclosed include at least the following embodiments. In one embodiment, a conditional direct memory access (DMA) channel activation system for executing a complex data transfer in a system-on-chip comprises: a look-up table constructed and arranged to store elements of an activation profile; and a trigger circuit that controls a DMA transaction according to the activation profile of the look-up table.

Alternative embodiments of the CDMA channel activation system include one of the following features, or any combination thereof.

The conditional DMA channel activation system further comprises a comparison circuit that performs a computer logic operation on a first operand and a second operand, wherein the trigger circuit triggers a data instruction in response to the computer logic operation.

The look-up table stores at least one of the first operand and the second operand, and a mask value for generating an activation condition.

The conditional DMA channel activation system further comprises a linking module that links a first conditional DMA channel activation (CDCA) channel having a value stored at the look-up table to a second CDCA channel when a CDCA triggered mode to allow a chain of activation conditions to be part of a triggering operation of a DMA transaction executed by the trigger circuit.

The trigger circuit activates a DMA channel or links to another CDCA channel, wherein the DMA channel is triggered to execute a copy operation from a peripheral device to a random access memory (RAM), and the CDCA channel defines an action corresponding to the activation profile in the look-up table.

The conditional DMA channel activation system operates according to the look-up table in a software mode or a triggered mode.

The triggered mode includes one of an event mode, a timer mode, or a linked mode.

The comparison circuit receives a trigger signal from a software bit, an IP flag, or another CDCA channel.

The look-up table comprises a set of fields for data entry inputs including one or more of an entry field, a domain identification field, a DMA CDCA trigger field, an address field, a mask field, a result operand field, an operation field, a DMA channel trigger field, and a conditional DMA Channel trigger field.

In another embodiment, direct memory access (DMA) controller comprises a look-up table constructed and arranged to store elements of an activation profile; a trigger circuit that controls a DMA transaction according to the activation profile of the look-up table; and a comparison circuit that performs a computer logic operation on a first operand and a second operand, at least the second operand stored at the look-up table, which permits a value in a memory location to be processed by the trigger circuit to trigger the DMA transaction.

Alternative embodiments of the DMA controller include one of the following features, or any combination thereof.

The look-up table stores at least one of the first operand and the second operand, and further stores a mask value for generating an activation condition.

The DMA controller further comprises a linking module that links a first conditional DMA channel activation (CDCA) channel having a value stored at the look-up table to a second CDCA channel when a CDCA triggered mode to allow a chain of activation conditions to be part of a triggering operation of a DMA transaction executed by the trigger circuit.

The DMA channel is triggered to execute a copy operation from a peripheral device to a random access memory (RAM), and the CDCA channel defines an action corresponding to the activation profile in the look-up table.

The conditional DMA channel activation system operates according to the look-up table in a software mode or a triggered mode.

The triggered mode includes one of an event mode, a timer mode, or a linked mode.

The comparison circuit receives a trigger signal from a software bit, an IP flag, or another CDCA channel.

The comparison circuit performs the comparison or logic operation before triggering the trigger circuit triggers the DMA transaction so that any bit in a computer memory location is available to trigger that DMA transaction.

In another embodiment, a method for activating a conditional direct memory access (DMA) channel to execute a complex data transfer comprises reading, by a DMA controller, a memory location defined in a look-up table, the look-up table constructed and arranged to store elements of an activation profile; performing, by the DMA controller, a mask or logic operation with an operand stored in the look-up table; determining a match in response to comparing an operand modified by a mask value of the look-up table to a result operand of the look-up table; and triggering a channel defined in the activation profile or another read compare operation in the look-up table.

Alternative embodiments of the method include one of the following features, or any combination thereof.

Triggering the channel includes operating according to the look-up table in a software mode or a triggered mode. The triggered mode includes one of an event mode, a timer mode, or a linked mode.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A conditional direct memory access (DMA) channel activation system for executing a complex data transfer in a system-on-chip, comprising:
 a look-up table constructed and arranged to store elements of an activation profile;
 a trigger circuit that controls a DMA transaction according to the activation profile of the look-up table; and
 a comparison circuit that performs a computer logic operation on a first operand and a second operand, wherein the trigger circuit triggers a data instruction in response to the computer logic operation.

2. The conditional DMA channel activation system of claim 1, wherein the look-up table stores at least one of the first operand and the second operand, and a mask value for generating an activation condition.

3. The conditional DMA channel activation system of claim 1, further comprising a linking module that links a first conditional DMA channel activation (CDCA) channel having a value stored at the look-up table to a second CDCA channel when a CDCA triggered mode allows a chain of activation conditions to be part of a triggering operation of a DMA transaction executed by the trigger circuit.

4. The conditional DMA channel activation system of claim 1, wherein the trigger circuit activates a DMA channel or links to another CDCA channel, wherein the DMA channel is triggered to execute a copy operation from a peripheral device to a random access memory (RAM), and the CDCA channel defines an action corresponding to the activation profile in the look-up table.

5. The conditional DMA channel activation system of claim 1, wherein the conditional DMA channel activation system operates according to the look-up table in a software mode or a triggered mode.

6. The conditional DMA channel activation system of claim 5, wherein the triggered mode includes one of an event mode, a timer mode, or a linked mode.

7. The conditional DMA channel activation system of claim 1, wherein the comparison circuit receives a trigger signal from a software bit, an IP flag, or another CDCA channel.

8. The conditional DMA channel activation system of claim 1, wherein the look-up table comprises a set of fields for data entry inputs including one or more of an entry field, a domain identification field, a DMA CDCA trigger field, an address field, a mask field, a result operand field, an operation field, a DMA channel trigger field, and a conditional DMA Channel trigger field.

9. A direct memory access (DMA) controller, comprising:
a look-up table constructed and arranged to store elements of an activation profile;
a trigger circuit that controls a DMA transaction according to the activation profile of the look-up table; and
a comparison circuit that performs a computer logic operation on a first operand and a second operand, at least the second operand stored at the look-up table, which permits a value in a memory location to be processed by the trigger circuit to trigger the DMA transaction.

10. The DMA controller of claim 9, wherein the look-up table stores at least one of the first operand and the second operand, and further stores a mask value for generating an activation condition.

11. The DMA controller of claim 9, further comprising a linking module that links a first conditional DMA channel activation (CDCA) channel having a value stored at the look-up table to a second CDCA channel when a CDCA triggered mode allows a chain of activation conditions to be part of a triggering operation of a DMA transaction executed by the trigger circuit.

12. The DMA controller of claim 9, wherein the trigger circuit causes a DMA channel to execute a copy operation from a peripheral device to a random access memory (RAM), and the CDCA channel defines an action corresponding to the activation profile in the look-up table.

13. The DMA controller of claim 9, wherein the DMA controller operates according to the look-up table in a software mode or a triggered mode.

14. The DMA controller of claim 13, wherein the triggered mode includes one of an event mode, a timer mode, or a linked mode.

15. The DMA controller of claim 9, wherein the comparison circuit receives a trigger signal from a software bit, an IP flag, or another CDCA channel.

16. The DMA controller of claim 9, wherein the comparison circuit performs the comparison or logic operation before triggering the trigger circuit triggers the DMA transaction so that any bit in a computer memory location is available to trigger that DMA transaction.

17. A method for activating a conditional direct memory access (DMA) channel to execute a complex data transfer, comprising:
reading, by a DMA controller, a memory location defined in a look-up table, the look-up table constructed and arranged to store elements of an activation profile;
performing, by the DMA controller, a mask or logic operation with an operand stored in the look-up table;
determining a match in response to comparing an operand modified by a mask value of the look-up table to a result operand of the look-up table; and
triggering a channel defined in the activation profile or another read compare operation in the look-up table.

18. The method of claim 17, wherein triggering the channel includes operating according to the look-up table in a software mode or a triggered mode.

19. The method of claim 18, wherein the triggered mode includes one of an event mode, a timer mode, or a linked mode.

\* \* \* \* \*